United States Patent [19]
Kotani et al.

[11] Patent Number: 5,349,291
[45] Date of Patent: Sep. 20, 1994

[54] SUPERCONDUCTING MAGNETIC SENSOR HAVING A CRYOSTAT FOR IMPROVED SENSITIVITY OF MAGNETIC DETECTION

[75] Inventors: Seigo Kotani; Takeshi Imamura, both of Kawasaki, Japan

[73] Assignee: Fujitsu Limited, Kawasaki, Japan

[21] Appl. No.: 77,413

[22] Filed: Jun. 16, 1993

[30] Foreign Application Priority Data

Jun. 23, 1992 [JP] Japan .................................. 4-165041

[51] Int. Cl.$^5$ .................... G01R 33/035; G01R 33/02
[52] U.S. Cl. ..................................... 324/248; 505/846
[58] Field of Search ................ 324/248; 505/845, 846

[56] References Cited
FOREIGN PATENT DOCUMENTS 64-16976 1/1989 Japan .
2-123774 5/1990 Japan .

Primary Examiner—Walter E. Snow
Attorney, Agent, or Firm—Nikaido, Marmelstein, Murray & Oram

[57] ABSTRACT

A superconducting magnetic sensor comprises an adiabatic vessel having an outer wall and an inner wall separated from the outer wall by an evacuated space, for holding a cooling medium, a thermal insulation filling the evacuated space, a cooling member having a first end physically fixed upon the inner wall of the adiabatic vessel and extending toward the outer wall, a superconducting pickup coil of a superconducting material for interlinking with an external magnetic flux, provided in the evacuated space in physical contact with the cooling member so as to be cooled by a cooling medium held in the vessel via the cooling member, a superconducting magnetic detection unit provided in the vessel so as to be immersed in the cooling medium, and a superconducting strip of a superconducting material connecting the superconducting pickup coil and the superconducting magnetic detection unit, the superconducting strip penetrating through the inner wall of the adiabatic vessel.

13 Claims, 8 Drawing Sheets

SUPERCONDUCTING MAGNETIC SENSOR HAVING A CRYOSTAT FOR IMPROVED SENSITIVITY OF MAGNETIC DETECTION

BACKGROUND OF THE INVENTION

The present invention generally relates to superconducting magnetic sensors using superconducting quantum interference devices (SQUIDs), and more particularly to a superconducting magnetic sensor having a cryostat for improved sensitivity of magnetic detection.

Conventionally, various magnetometers have been employed for the measurement of weak magnetic fields. Such magnetometers include Hall-effect devices, flux gate devices, and superconducting quantum interference devices. Among others, the superconducting quantum interference magnetometers using superconducting quantum interference devices (SQUID) for the magnetic field detection are capable of measuring extremely feeble magnetic fields (less than $10^{-10}$T) and find applications in various fields such as biomagnetic measurements, detection of gravitational radiation, and various geophysical applications.

Generally, superconducting devices have to be held in an extremely low temperature environment. For example, SQUIDs that use Josephson junctions of Nb/AlO$_x$/Nb have to be held at a temperature below 9.2K in order to be operational. Thus, conventional superconducting magnetic sensors have been accommodated in a cryostat that typically holds liquid helium as a cooling medium. Thereby, there arises a problem in that one cannot place the superconducting pickup coil of the magnetic sensor, which is also accommodated in the cryostat, close enough to the object that is under investigation. Thereby, the conventional superconducting magnetic sensors have been vulnerable to noise and suffered from the problem of low S/N ratio. Further, in the magnetic sensors for medical applications for obtaining local distribution of magnetic field of a biological body in particular, it is desirable to provide the pickup as close as possible to the biological body under investigation.

In order to avoid the foregoing problem, there is a proposal of a cryostat shown in FIG. 1 as disclosed in the Japanese Laid-open Patent Publication 64-16976, wherein the cryostat has a double vessel structure including an inner vessel 3 for accommodating therein liquid helium 2 and an outer vessel 4 for accommodating therein liquid nitrogen 5. The inner vessel 3 is immersed in the liquid nitrogen 5 for cooling, and a SQUID magnetic sensor 1 is immersed in the liquid helium 2. Each of the vessels 3 and 4 has a double wall structure forming a vacuum jar, and the penetration of heat into the vessel 3 and the evaporation of liquid helium are successfully minimized by cooling the inner vessel 3 by the liquid nitrogen 5.

In such a cryostat structure, the superconducting magnetic sensor 1 held in the liquid helium 2 is separated from the body under investigation by the outer vessel 4 and the inner vessel 3 both having the double wall structure, as well as by the liquid nitrogen 5 and the liquid helium 2. Thus, the superconducting pickup coil of the sensor 1, if provided within the liquid helium contained in the inner vessel 3, is inevitably separated from an object 8 that is under investigation by a substantial distance. In order to avoid the problem, the apparatus of FIG. 1 employs a pickup coil 6 of a high temperature superconductor in the liquid nitrogen 5. The high temperature superconductor forming the pickup coil 6 shows the superconductivity at the liquid nitrogen temperature and is coupled magnetically to the pickup coil of the magnetic sensor 1 held within the inner vessel 2 by forming a magnetic coupling 7 across the vessel wall of the inner vessel 3. Thereby, one can reduce the distance between the pickup coil 6 and the object 8 substantially.

FIG. 2 shows an example of the superconducting magnetic sensor 1 used in the apparatus of FIG. 1.

Referring to FIG. 2, the magnetic sensor 1 is the one disclosed in the U.S. Pat. No. 5,162,731 assigned to the same assignee of the present application and includes a superconducting pickup coil 111 that establishes the magnetic coupling 7 with the pickup coil 6 of FIG. 1. The pickup coil 111 thereby establishes an interlinking with an unknown magnetic flux $\Phi_x$ via the pickup coil 6 not shown in FIG. 2 and is coupled magnetically, at a superconducting coil 112, to a superconducting detection circuit 120 that includes Josephson junctions J1 and J2, wherein the Josephson junctions J1 and J2 form a SQUID 120 together with a superconducting coil 121 that establishes a magnetic coupling M2 with the superconducting coil 112. The SQUID 120 is biased by an a.c. bias circuit 122 and produces output voltage pulses in response to each current pulse of the a.c. bias current supplied from the bias circuit by causing a transition to the finite voltage state, provided that there is an unknown magnetic flux $\Phi_x$ interlinking with the pickup coil 111.

The voltage pulses thus obtained is on the one hand supplied to an output terminal and on the other hand to a superconducting feedback unit 118 wherein the superconducting feedback unit 118 includes a superconducting write gate 135 that is coupled magnetically to a superconducting coil 133 to which the output voltage pulses are supplied from the SQUID 120. The write gate 125 includes Josephson junctions J3 and J4 as well as a superconducting coil 132 that form together a SQUID 131, wherein the SQUID 131 is supplied with the output voltage pulses via the coil 133 as bias current. Further, the coil 133 establishes a magnetic coupling with the superconducting coil 132 and causes a transition to the finite voltage state in the SQUID 131 in response to each voltage pulse. Thereby, a flux quantum enters to the SQUID in response to each voltage pulse and is stored in a superconducting coil 136 having a large inductance value.

The superconducting coil 136 in turn produces a persisting current $I_{FB}$ with a magnitude corresponding to the number of flux quanta stored in the superconducting coil 136, and the persisting current $I_{FB}$ thus produced creates a magnetic flux at a superconducting coil 117 connected to the coil 136 via a superconducting line such that the magnetic flux cancels out the unknown magnetic flux $\Phi_x$. There, the superconducting coil 117 establishes a magnetic coupling M1 with a superconducting coil 113 forming a part of the superconducting pickup coil 111 and cancels out the induction current flowing therethrough. Until the induction current created in response to the unknown flux $\Phi_x$ is canceled out completely, the SQUID continues to produce the output voltage pulses and one can detect the direction and magnitude of the flux $\Phi_x$ by counting the number of the output voltage pulses.

Further, in order to increase the range of detection, heating elements 115 and 139 are provided for resetting the apparatus upon saturation of the superconducting coil 136 that stores the flux quanta.

As the circuit of FIG. 2 is fully described in the foregoing U.S. Pat. No. 5,162,731, further description thereof will be omitted.

Referring to FIG. 1 again, the construction of the cryostat still has a disadvantage in that the pickup coil 6 is separated from the object 8 by the inner and outer walls forming the double wall structure of the outer vessel 4 as well as the vacuum space formed therebetween. Thereby, one cannot reduce the distance between the coil 6 and the object 8 below about one centimeter. For example, assuming a thickness of about 3 mm for each of the walls forming the double wall structure of the vessel 3 and 4 and further for the vacuum space included in each double wall structure, the distance between the pickup coil 6 and the object 8 cannot be reduced below 12 mm.

Thus, the conventional apparatus of FIG. 1 has failed to provide satisfactory sensitivity for detecting the magnetic field of the object 8. When the thickness of the vacuum space is reduced for reducing the distance, on the other hand, the penetration of heat into the liquid nitrogen would become excessive because of increased radiation heat transfer. Further, such a penetration of heat tends to cause a chilling of the outer wall of the vessel 4 that in turn may injure the object 8, particularly when the object 8 is a biological body. Moreover, the apparatus of FIG. 1 has a drawback in that one cannot achieve a satisfactory magnetic coupling 7 between the pickup coil 6 and the SQUID sensor 1 across the double wall structure of the inner vessel 3, because of the large distance between the superconducting coils forming the magnetic coupling 7.

SUMMARY OF THE INVENTION

Accordingly, it is a general object of the present invention to provide a novel and useful superconducting magnetic sensor wherein the foregoing problems are eliminated.

Another and more specific object of the present invention is to provide a superconducting magnetic sensor for detecting an unknown magnetic field produced from an object, wherein the separation between a superconducting pickup loop and the object is minimized.

Another object of the present invention is to provide a superconducting magnetic sensor for detecting an unknown magnetic field produced from an object, comprising:

an adiabatic vessel having an outer wall and an inner wall separated from said outer wall by an evacuated space, said inner wall forming a depression for holding a cooling medium therein;

a thermal insulation of a thermally insulating material, provided to fill said evacuated space for insulating thermally said inner wall and said outer wall from each other;

a cooling member having a first end physically fixed upon said inner wall of said adiabatic vessel and extending toward said outer wall, said cooling member having a second, opposite end facing said outer wall with a separation therefrom;

a superconducting pickup coil of a superconducting material for interlinking with an external magnetic flux, said superconducting pickup coil being provided in said evacuated space in physical contact with said cooling member so as to be cooled by said cooling medium via said cooling member;

a superconducting magnetic detection unit provided in said depression so as to be immersed in said cooling medium, said superconducting magnetic detection unit detecting said external magnetic flux that has caused interlinking with said superconducting pickup coil upon cooling to a superconducting state by said cooling medium; and superconducting strip means of a superconducting material connecting said superconducting pickup coil and said superconducting magnetic detection unit, said superconducting strip means penetrating through said inner wall of said adiabatic vessel.

According to the present invention, one can achieve a satisfactory thermal insulation for the interior of the inner wall with respect to the exterior of the outer wall, including the cooling medium and the superconducting magnetic detection unit, while simultaneously holding the superconducting pickup coil close to the object. By providing the superconducting pickup coil adjacent to the second end of the cooling member, it is possible to place the pickup coil such that only the outer wall of the vessel separates substantially the pickup coil from the object. The pickup coil is held in the superconducting state by cooling via the cooling member. By optimizing the size and shape of the cooling member, it is possible to minimize the penetration of heat into the interior of the inner wall while simultaneously maintaining the pickup coil in the superconducting state.

Other objects and further features of the present invention will become apparent from the detailed description of the preferred embodiments if read in conjunction with the attached drawings.

DETAILED DESCRIPTION OF THE PREFERRED EMBODIMENT

Figure 3:
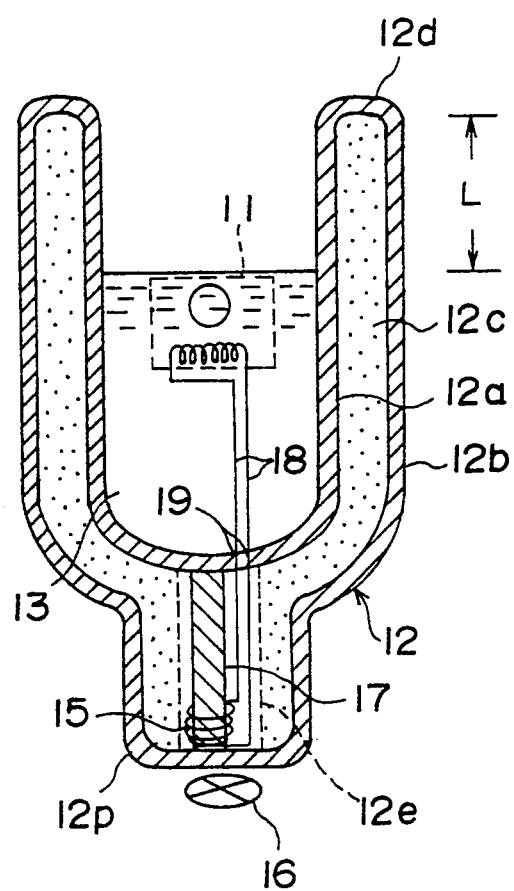
FIG. 3 is a diagram showing the construction of a superconducting magnetic sensor apparatus according to a first embodiment of the present invention.

FIG. 3 shows the superconducting magnetic sensor according to a first embodiment of the present invention.

Figure 1:
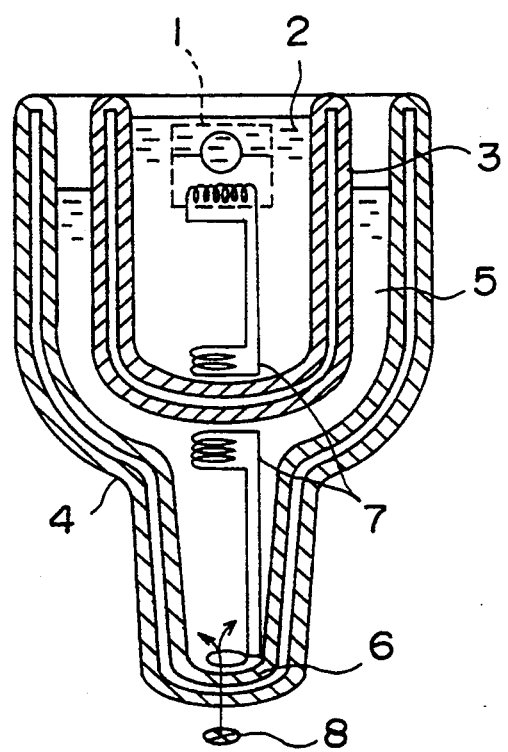
FIG. 1 is a diagram showing the construction of a conventional superconducting magnetic sensor apparatus having a cryostat.
Figure 2:
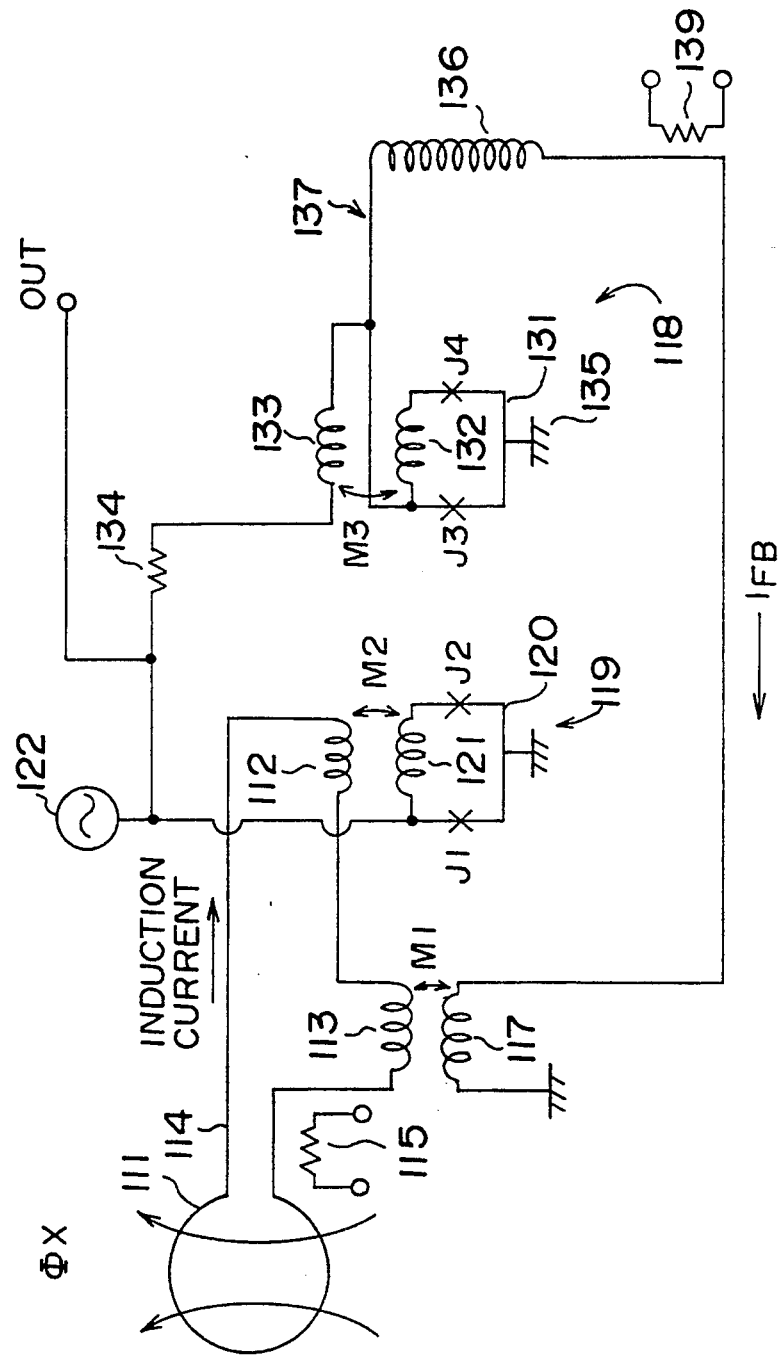
FIG. 2 is a circuit diagram showing the construction of a SQUID sensor used in the apparatus of FIG. 1.

Referring to FIG. 3, the superconducting magnetic sensor of the present embodiment includes an adiabatic vessel 12 having a double wall structure, wherein the vessel 12 includes an inner wall 12a and an outer wall 12b separated from each other by a vacuum space 12c. Typically, the walls 12a and 12b have a thickness of about 3 mm, and the vessel 12 is formed of a fiber reinforced plastic (FRP). As usual in the adiabatic vacuum jar, the inner wall 12a and the outer wall 12b are connected at a bridging part 12d at the top rim of the vessel 12. Further, a liquid helium 18 is filled in a space 13 defined by the inner wall 12a, and a SQUID magnetic sensor 11 corresponding to the SQUID sensor of FIG. 2 is immersed in the liquid helium 13. In order to eliminate the penetration of heat into the liquid helium 18 via the vessel walls 12a and 12b by heat conduction, the vessel 12 is formed such that the top rim of the vessel 12 is located at a sufficiently large distance L from a predetermined surface position of the liquid helium 13 that is held in the space 13.

The vacuum space 12c between the inner wall 12a and the outer wall 12b is filled by a multiple-layer insulation known commonly as "super-insulation" to be described later with reference to FIG. 4. Further, in correspondence to the bottom of the outer wall 12b, there is provided a projection 12p protruding in a downward direction, and an elongated member 17 of a thermally conductive material is fixed upon the bottom part of the inner wall 12a in correspondence to the projection 12p, in physical contact with the outer surface of the wall 12a, such that the member 17 extends toward the bottom of the outer wall 12b forming the bottom projection 12p. In order to accommodate the member 17 in the multiple-layer insulation 12c, there is formed an elongated space 12e in the multiple-layer insulation 12c to extend in conformity with the size and shape of the member 17 from the outer surface of the inner wall 12a to the inner surface of the outer wall 12b in correspondence to the projection 12p, and the member 17 is provided within the space 12e.

Typically, the member 17 is formed of a rod or sleeve having a diameter of several millimeters and is so provided that the free end of the member 17 is separated from the outer wall 12b forming the projection 12p by a distance of less than a few millimeters. Further, in correspondence to the free end of the member 17, a pickup coil 15 of a superconducting material is wound upon the member 17 so as to establish an intimate physical contact therewith, and the pickup coil 15 is connected to a SQUID magnetic sensor 11 corresponding to the magnetic sensor of FIG. 2 via a superconducting conductor wire 18 that penetrates through the inner wall 12a at a superconducting relaying element that is embedded in the wall 12a. Thereby, the pickup coil 15 is cooled by the liquid helium 13 via the elongated member 17 to a superconducting state.

In view of the fact that the apparatus of FIG. 3 used as a magnetic sensor, the elongated member 17 should be substantially transparent to magnetic flux. Thus, a non-magnetic material is has to be used for the member 17. Because of this reason, a FRP is used for the member 17. It should be noted that a FRP is not a good thermal conductor as compared with metals. However, in spite of the fact that the FRP is not a good heat conductor comparable to metals, it still has a finite heat conductivity and eventually cools the pickup coil 15 by transferring the heat from the coil 15 to the liquid helium 13 by heat conduction when cooled by the liquid helium for sufficient duration.

According to the construction of FIG. 3, it will be noted that the distance between the pickup coil 15 and an object 16 that is subjected to magnetic detection is successfully minimized. In fact, the distance between the pickup coil 15 and the object 16 can be less than a few millimeters even when the thickness of the wall 12b and the separation of the coil 15 from the inner surface of the wall 12b are taken into consideration. It should be noted that the wall 12b has a thickness of about 1 mm in correspondence to the projection 12p. It should be noted further that the consumption of liquid helium by the heat conduction via the member 17 is minimum because of the reduced diameter of the member 17. Particularly, the penetration of heat into the liquid helium 13 can be minimized by using a sleeve for the member 17. Thereby, the consumption of liquid helium can be minimized and the damage to the object 16 as a result of chilling of the wall 12b is eliminated simultaneously.

Figure 4:
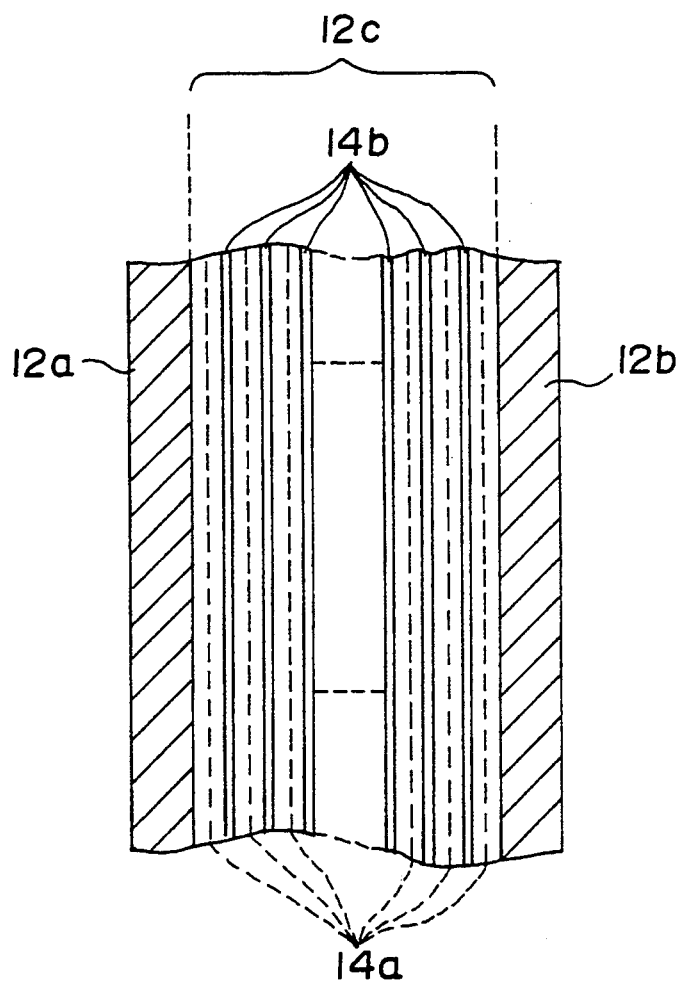
FIG. 4 is a diagram showing the construction of the thermal insulation medium used in the apparatus of FIG. 3.

FIG. 4 shows the structure of the multiple-layer insulation that fills the vacuum space 12c in a cross sectional view.

Referring to FIG. 4, the multiple-layer insulation includes a plurality of polyester insulation layers 14a each having a honeycomb structure and a reflection coating 14b of aluminum deposited thereon. By staking the insulation layers 14a to form a laminated structure, the reflection coating 14b is sandwiched between two insulation layers 14a. The honeycomb structure forming the insulation layer 14a has a plurality of cells communicating with each other, and the cells are held vacuum upon evacuation of the space 12c. The construction of the multiple-layer insulation itself is already known publicly and is used for various applications such as superconducting railroad, and the like.

Figure 5:
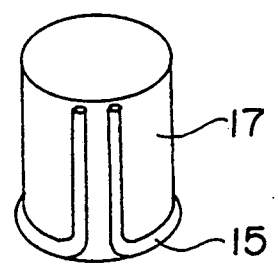
FIGS. 5(A) and 5(B) are diagrams showing the construction of a superconducting pickup coil together with a rod member used in the magnetic sensor of FIG. 3 for supporting and for cooling the pickup coil.
Figure 5:
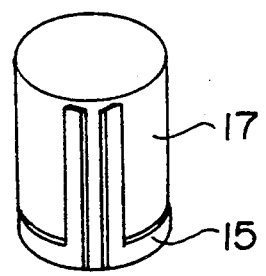

FIGS. 5(A) and 5(B) show the superconducting pickup coil 15 in detail, wherein FIG. 5(A) shows an example wherein a superconducting wire of a Nb alloy such as NbTi, $Nb_3Ge$, $Nb_3Al$, and the like, is wound upon the elongated member 17. In the example of FIG. 5(B), the pickup coil 15 is formed by depositing a Nb layer upon the surface of the member 17 by sputtering, and the like, and further by patterning the same by a photolithographic process. Any of the constructions may be employed for the pickup coil 15, wherein the construction of FIG. 5(B) is preferable because of the improved accuracy of the pattern and improved contact between the coil and the member or bobbin 17.

Figure 6:
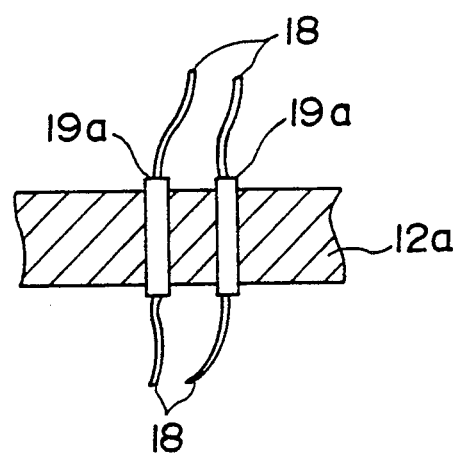
FIGS. 6(A) and 6(B) are diagrams showing the construction of a superconducting interconnection used in the apparatus of FIG. 3 for providing a superconducting signal path across a vessel wall.
Figure 6:
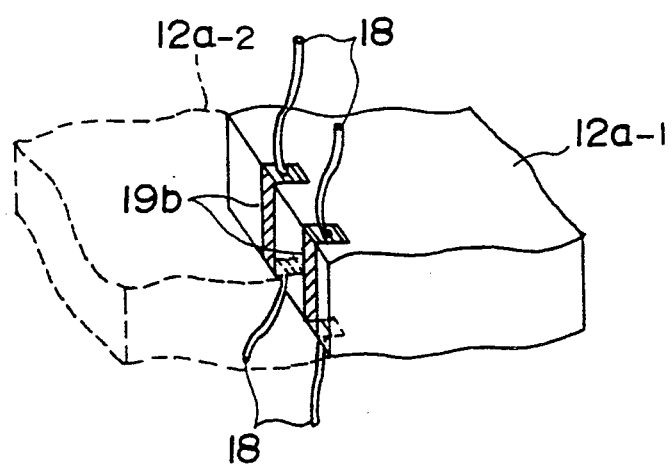

FIGS. 6(A) and 6(B) are diagrams showing the embodiment of the relaying member 19, wherein the embodiment of FIG. 6(A) includes a superconducting pin 19a of a metal such as Nb-alloy embedded in a through hole that is provided in the wall 12a. Such a superconducting pin 19a can be provided by drilling a hole through the wall 12a and fitting the pin 19a into the hole thus formed. Further, the pin 19a is fixed into the wall 12a by an epoxy resin. The pin 19a typically has a diameter of less than 0.1 mm, and the seal of the through hole for maintaining the space 12a vacuum can be easily achieved by the epoxy resin that fixes the pin 19a in the through hole.

FIG. 6(B) shows another embodiment of the relaying member 19 applied to the vessel 12 that is formed by connecting or bonding separate wall blocks that are formed separately. Referring to FIG. 6(B), the relaying member is provided as a bridging conductor pattern 19b provided at where two blocks $12a_1$ and $12a_2$ forming the wall 12a, are connected with each other. The bridging conductor pattern 19b is formed typically be depositing a layer of a superconducting alloy and patterning the same subsequently.

Figure 7:
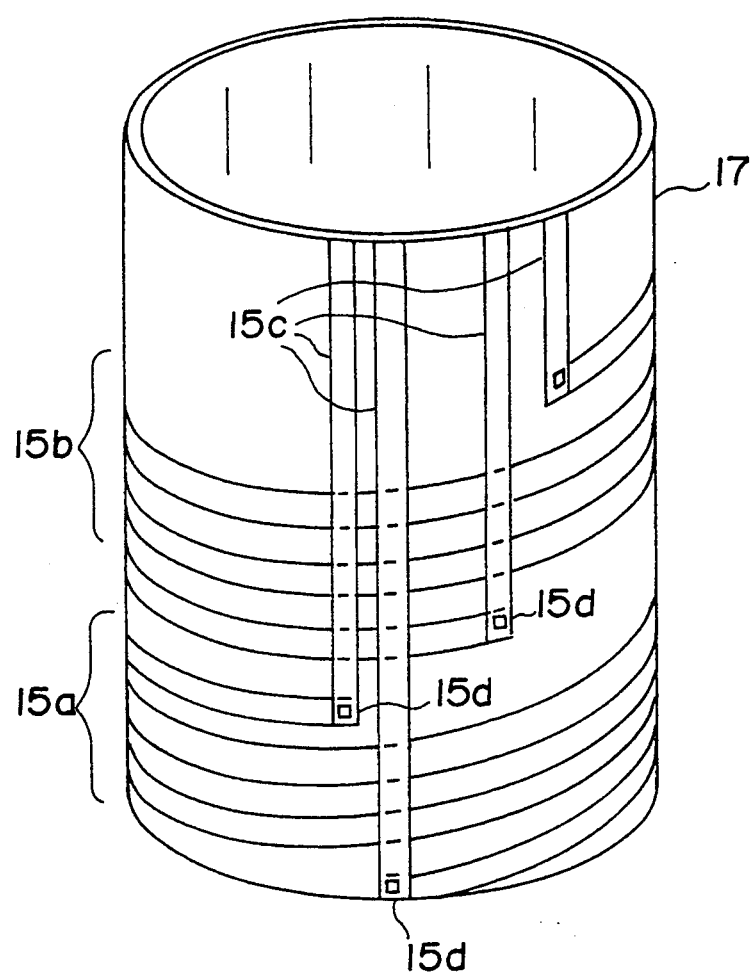
FIG. 7 is a diagram showing another embodiment of the present invention.

FIG. 7 shows another embodiment of the present invention wherein two superconducting pickup coils 15a and 15b are provided on the sleeve member 17. Such a pattern of coil can be easily formed by the deposition and patterning of superconducting alloy layer on the sleeve 17. Each of the coils 15a and 15b are covered by an insulation film not illustrated, and superconducting leads 15c are provided on such an insulation film to extend in the axial direction of the sleeve 17. Thereby, the superconducting leads 15c establishes a superconducting electric connection with the corresponding coil at contact holes 15d provided in the insulation film. In the present embodiment, the pickup coils 15a and 15b are wound in mutually opposite directions and can be used for detecting the first or second differentials of the detected magnetic field. Thereby, one can cancel out the effect of the magnetic field of non-local origin such as the terrestrial magnetic field.

Figure 8:
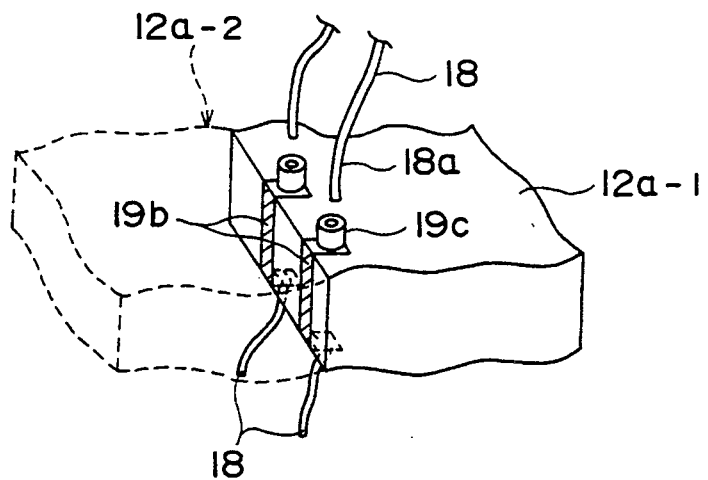
FIG. 8 is a diagram showing another embodiment of the present invention.

FIG. 8 shows another embodiment of the present invention, wherein there is provided a detachable connector 19c on the bridging conductor pattern 19b in correspondence to the inner surface of the vessel wall 12a. The connector 19c is formed of a superconducting alloy and provided with an insertion opening for detachably accommodating a tip end part 18a of the superconducting lead 18. By providing the lead 18 to be detachable with respect to the bridging conductor pattern 19b and hence to the pickup coil 15, one can easily replace the superconducting magnetic sensor 11 when the sensor 11 has become defective.

Figure 9:
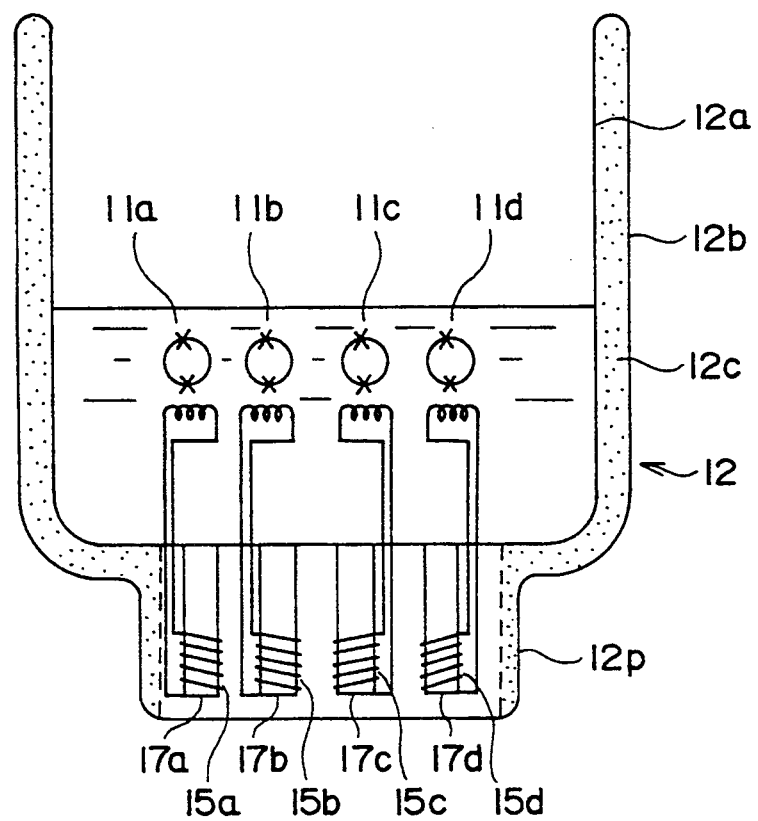
FIG. 9 is a diagram showing still other embodiment of the present invention.

FIG. 9 shows another embodiment of the present invention, wherein there are provided a plurality of rod members or sleeves 17a–7d respectively wound by superconducting pickup coils 15a–15d. Thereby, each of the pickup coils 15a–15d supplies a detection current to a corresponding one of superconducting magnetic sensors 11a–11d. By providing the pickup coils in a plurality of numbers, one can detect a two-dimensional profile of magnetic field formed by an object. Further, such a construction allows one to use an alternative magnetic sensor upon failure of a magnetic sensor, without modifying the construction of the device.

Further the present invention is not limited to the embodiments described heretofore, but various variations and modifications may be made without departing from the scope of the present invention.

What is claimed is:

1. A superconducting magnetic sensor for detecting an unknown magnetic field produced from an object, comprising:
    an adiabatic vessel having an outer wall and an inner wall separated from said outer wall by an evacuated space, said inner wall forming a depression for holding a cooling medium therein;
    a thermal insulation of a thermally insulating material, provided to fill said evacuated space for insulating thermally said inner wall and said outer wall from each other;
    a cooling member having a first end physically fixed upon said inner wall of said adiabatic vessel and extending toward said outer wall, said cooling member having a second, opposite end facing said outer wall with a separation therefrom;
    a superconducting pickup coil of a superconducting material for interlinking with an external magnetic flux, said superconducting pickup coil being provided in said evacuated space in physical contact with said cooling member so as to be cooled by said cooling medium via said cooling member;
    a superconducting magnetic detection unit provided in said depression so as to be immersed in said cooling medium, said superconducting magnetic detection unit detecting said external magnetic flux that has caused interlinking with said superconducting pickup coil upon cooling to a superconducting state by said cooling medium; and
    superconducting strip means of a superconducting material connecting said superconducting pickup coil and said superconducting magnetic detection unit, said superconducting strip means penetrating through said inner wall of said adiabatic vessel.

2. A superconducting magnetic sensor as claimed in claim 1, wherein said superconducting pickup coil is provided at said second end of said cooling member.

3. A superconducting magnetic sensor as claimed in claim 1, wherein said cooling member comprises a rod of a non-magnetic material extending from said first end to said second end, and wherein said superconducting pickup coil is wound upon said rod.

4. A superconducting magnetic sensor as claimed in claim 1, wherein said cooling member comprises a sleeve of a non-magnetic material extending from said first end to said second end, and wherein said superconducting pickup coil is wound upon said sleeve.

5. A superconducting magnetic sensor as claimed in claim 1, wherein said superconducting pickup coil comprises a plurality of superconducting coils wound upon said cooling member in an elongating direction of said cooling member.

6. A superconducting magnetic sensor as claimed in claim 5, wherein said plurality of superconducting coils comprises a first coil wound upon said cooling member in a first direction and a second coil wound upon said cooling member in a second, opposite direction.

7. A superconducting magnetic sensor as claimed in claim 1, wherein said outer wall of said adiabatic vessel has a projection protruding in an outward direction in correspondence to where said cooling member is provided such that said projection extends toward an object of which magnetic field is to be measured.

8. A superconducting magnetic sensor as claimed in claim 1, wherein said superconducting strip means comprises a superconducting pin embedded in a through hole that is provided on said inner wall of said adiabatic vessel for connecting a first superconducting lead connected to said superconducting pickup coil and a second superconducting lead connected to said superconducting magnetic detection unit.

9. A superconducting magnetic sensor as claimed in claim 1, wherein said superconducting strip means comprises a superconducting bridge pattern provided on said inner wall of said adiabatic vessel to extend from a first side thereof on which said cooling member is provided and a second, opposite side.

10. A superconducting magnetic sensor as claimed in claim 1, wherein said superconducting magnetic detection unit includes a plurality of Josephson junctions forming a superconducting quantum interferometer.

11. A superconducting magnetic sensor as claimed in claim 1, wherein said thermal insulation comprises a lamination of a plurality of honeycomb layer each having a honeycomb structure therein and a reflective coating provided on a surface thereof.

12. A superconducting magnetic sensor as claimed in claim 1, wherein said superconducting strip means comprises a first part extending within said depression from said inner wall to said superconducting magnetic detection unit in electrical connection thereto and a second part extending from said inner wall to said superconducting pickup coil, said first and second parts being connected detachable from each other at said inner wall in correspondence to where said superconducting strip means penetrates through said inner wall of said adiabatic vessel.

13. A superconducting magnetic sensor as claimed in claim 1, wherein said superconducting magnetic sensor includes a plurality of said superconducting pickup coil and a plurality of said cooling member, each of said superconducting pickup coil being provided in physical contact with corresponding one of said cooling members.

* * * * *